May 24, 1966 R. D. HANCOCK ET AL 3,252,205

THERMOELECTRIC UNITS

Filed Feb. 11, 1963

Inventors
ROBERT D. HANCOCK
DANIEL S. BRUSH
By JOHN W. BOWDEN

Anderson, Luedeka, Fitch, Even & Tabin Attys

United States Patent Office 3,252,205

Patented May 24, 1966

3,252,205

THERMOELECTRIC UNITS

Robert D. Hancock, Poway, and Daniel S. Brush and John W. Bowden, San Diego, Calif., assignors to General Dynamics Corporation, New York, N.Y., a corporation of Delaware Filed Feb. 11, 1963, Ser. No. 257,624

4 Claims. (Cl. 29—155.5)

Figures 1, 2, 3, 4, 5:
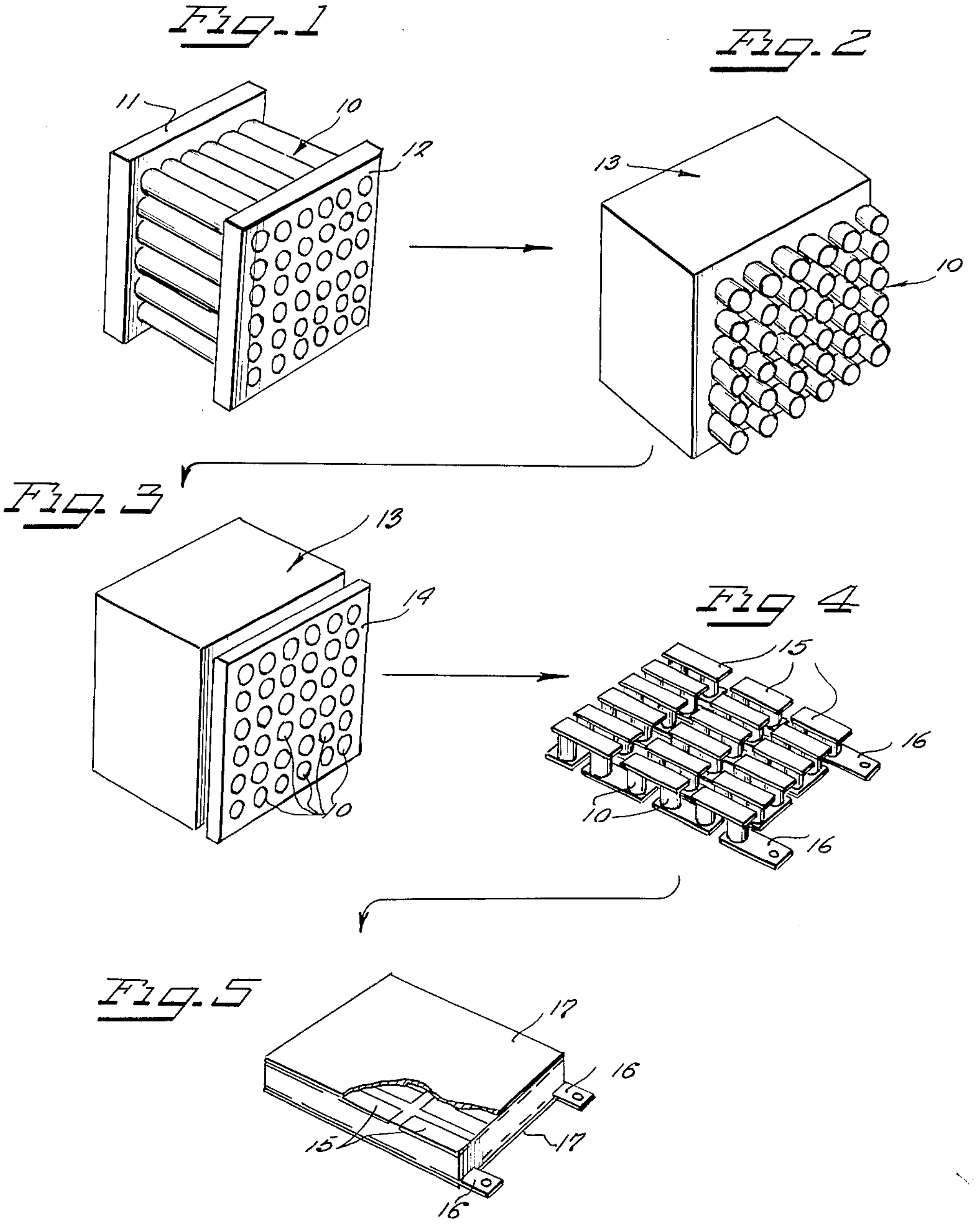

This invention relates to thermoelectric units and more particularly to an improved method of fabricating thermoelectric modules.

Recent technological advances have led to the realization that the Peltier effect can be advantageously utilized to effect refrigeration and cooling operations. Moreover, the employment of the Seebeck effect for current generating purposes has received wide acceptance. For example, cooling and refrigeration units, particularly small compact units that employ thermoelectric cooling modules, are usable in a variety of diverse situations. Although the applications for these and other small compact thermoelectric units has been recognized, the thermoelectric cooling apparatus and various current generators which have previously been developed have not proven to be sufficiently low in cost to warrant widespread commercial use of such units. One major drawback to the realization of low cost yet efficient thermoelectric units has been the unavailability of a practical, efficient and low cost method of fabricating these units on a large scale production basis.

It is the prime object of the present invention to provide an improved process for fabricating thermoelectric modules that can be utilized in a variety of applications.

A further object of the present invention is to provide a relatively low cost method of fabricating thermoelectric modules whereby compact and efficient modules requiring a minimum amount of semiconductor material can be produced on a large scale production basis.

Other objects and advantages of the present invention will become apparent from the following description thereof when considered in conjunction with the accompanying drawings wherein:

FIGURES 1–5 illustrates a thermoelectric module at various stages throughout the improved module fabrication process contemplated by the present invention.

In general, the present invention is directed to an improved method of fabricating thermoelectric units, commonly referred to as "modules." Basically, the method contemplates the in-line production of large quantities of these modules which can be utilized either for cooling or current generating purposes. That is, the invention provides an improved fabrication method that yields compact units having attractive operational characteristics and minimizes the amount of thermoelectric material required in the production thereof.

The fabrication method calls for the assembly of a plurality of rods of suitable thermoelectric materials (preferably semiconductors) within a supporting structure and the molding of a suitable plaster supporting material around the assembled units so that they are confined within a workable structure and maintained in the desired assembled configuration. The plaster supporting block including the assembled rods of thermoelectric material are subjected to a cutting process whereby a plurality of slices having a preselected thickness are cut from the block so that the entire quantity of material is utilized. The relatively thin slices which are cut from the block are thereafter immersed in successive baths of suitable materials. These materials constitute the heat conductive soldering agents for a plurality of individual bus bar elements that are joined to the ends of the segments confined within the plaster supporting structure of each slice.

In this connection, each slice is subsequently placed within a suitable die structure wherein the soldering of the bus bars to the exposed ends of the segments is effected. Subsequent to the joinder of the bus bars to the exposed ends of the segments, the partially assembled unit is thereafter immersed in a solution which effects the dissolving of the plaster supporting material. The dissolving of the supporting material leaves a self-supporting structure including the semiconductor segments and the copper bus bars which are joined thereto. Suitable electrically insulated, thermally conductive plates are thereafter joined to the exposed surfaces of the copper bus bars. Finally, a suitable insulating material is provided to fill the interstices remaining in the assembled structure between the cooling and heat dissipating plates and the unit is sealed against ingressive moisture. The unit thus formed is suitable for individual use or in conjunction with a plurality of similar units for larger scale applications.

It is well known that the efficiency of any thermoelectric unit, which takes advantage of either the Peltier or Seebeck effect is dependent upon the nature of various significant characteristics of the dissimilar materials that are utilized to form the various thermocouple junctions within the module. Semiconductor materials such as n and p type bismuth telluride, zinc antimonide, lead telluride and the like have proven to be highly desirable materials for forming the necessary couples of such a thermoelectric module, and the preferred embodiment of the method as hereinafter described in detail contemplates employing such materials in the fabrication process.

More particularly, the fabrication of a thermoelectric module is begun by arranging n and p type bismuth telluride rods, generally designated by the numeral 10, in alternate fashion between a pair of apertured supporting blocks 11 and 12, as shown in FIGURE 1. (Although this may be considered the initial step to the fabrication process, it should be understood that the n and p type bismuth telluride rods are subjected to an initial inspection to determine the conformity of these rods to such requirements as size, thermal conductivity, Seebeck coefficient, electrical resistivity and the like.) To aid in the identification and suitable assembly of the rods 10 in alternate fashion between the apertured supporting blocks 11 and 12, the n type bismuth telluride rods are coated with one identifying color (e.g. blue) and the p type bismuth telluride rods are coated with another color (e.g. red).

After the assembly of the rods within the supporting blocks 11 and 12, the assembled unit (as shown in FIGURE 1) is placed within a suitable mold (not shown) including a molding cavity. The molding cavity is preferably proportioned to readily accommodate the assembled unit while at the same time providing for the introduction of a suitable plaster supporting medium thereto. For example, the rectangular dimensions of the cavity are preferably selected so that the supporting medium can be poured in paste form over the top of the assembled unit positioned therein. The mold is vibrated as the plaster supporting medium is introduced to the cavity to allow the medium to fill the gaps and interstices between the alternate n and p type rods 10 confined between the supporting blocks 11 and 12.

After the supporting medium has had sufficient time to "set," the partially assembled unit will resemble the structure depicted in FIGURE 2 wherein the ends of the alternate rods of n and p type bismuth telluride are shown protruding from the casting, which is designated 13, subsequent to the removal of the supporting blocks 11 and 12.

Although various plaster supporting media may be employed to carry out this step of the fabrication process, it is preferable that a suitable mixture of magnesium chloride magnesium oxide including an aggregate of limestone be used for this purpose. One medium of this type, which is designated a sorel type cement, is commercially available under the tradename "Hiola." As hereinafter described, this type of supporting medium is preferable since it provides a strong supporting structure for the assembled rods 10 and is soluble in a solution of hydrochloric acid.

The casting 13 including the alternate n and p type bismuth telluride rods 10 is allowed to cure and is then ready for subsequent slicing operations. In this connection, the casting 13 is mounted within a suitable supporting structure and cut into relatively thin slices (e.g. ⅛ inch) by an abrasive saw. The end pieces including the protruding segments of the semiconductor rods are sliced somewhat thicker so that the protruding rods are held in place. This salvaged portion of the casting 13 is thereafter recast and sliced so that the entire length of each semiconductor rod 10 is utilized.

FIGURE 3 illustrates a slice 14 of the supporting casting 13 including the alternately arranged cylindrical rods 10 of n and p type bismuth telluride. Although the slices 14 are relatively thin, the supporting medium renders them sufficiently strong to undergo wet sanding that removes any saw marks from the exposed ends of the rods and adjusts the length thereof to the nearest thousandth of an inch. This operation is important to the successful bonding of copper bus bars to the ends of the segments, as hereinafter described.

The bonding of a suitable array of copper bus bars to the exposed ends of the cylindrical rods 10 is initiated by coating the entire slice 14 with a suitable flux material such as zinc chloride in aqueous solution. The flux is applied to the slice after it has undergone a drying process in an oven of conventional design for a period of one hour at a temperature of 95° C. whereby any residual moisture within the slice is removed.

Subsequent to the drying and flux coating operations, the slice is completely immersed in a bath of molten bismuth. Since only the end portions of the cylidrical rods 10 are exposed to the molten bismuth, the bismuth adheres only to these end portions. After the slice 14 has been removed from the bath, it is shaken or jarred to remove any excess bismuith therefrom. This exposure of the ends of the n and p type bismuth telluride rods 10 to the molten bismuth results in a small amount of the bismuth telluride being dissolved. As a consequence, an intimate metallurgical bond is formed, which is mechanically strong due to the alloying and diffusion effected by the molten bismuth.

Subsequent to the initial coating of the ends of the bismuth telluride rods 10, the slice 14 is similarly immersed in a molten bath of a suitable soldering material such as a bismuth-tin eutectic alloy. The surface tension of the bismuth-tin eutectic alloy causes this soldering substance to adhere to the exposed ends of each of the cylindrical segments. The slice 14 is carefully removed from this bath so as to allow a hemispherical mound of the tin-bismuth alloy to be retained on the exposed end portions. This hemispherical mound of the bismuth-tin eutectic alloy serves as a soldering agent for a plurality of bus bars 15 that are secured in a preselected configuration to the ends of the rods 10, as shown in FIGURE 4.

More particularly, the bus bars 15, which are preferably fabricated of copper, are positioned within a pair of composition rubber supporting molds or holders having a plurality of shallow rectangular receptacles provided in the upper surface thereof to receive the bus bars in distinct preselected configurations. These rubber supporting molds preferably include a mixture of graphite, aluminum and silastic rubber. The graphite and aluminum serve to increase the thermal conductivity of the supporting molds and render the molds structurally stable.

Preferably, the receptacles of one of the molds are arranged so that the rectangular bus bars which form the cold junctions for each pair of adjacent dissimilar bismuth telluride rods 10 have their lengthwise axes aligned. Another of the molds has the receptacles positioned therein so that copper bus bars which form the individual hot thermocouple junctions are arranged to connect the couples in a manner providing a series path for current flow therethrough. A pair of the receptacles in this latter bus bar supporting mold is arranged so that two of the bus bars, which are designated by the numeral 16 in FIGURE 4, extend outwardly from the otherwise rectangular configuration of the bus bar arrangement.

After the copper bus bars 15 are located in the supporting molds, a first of the molds is placed in a metal die set. Thereafter, the slice 14 is positioned in the die set in alignment with the mold, and the second bus bar supporting mold is placed in the die set in an inverted position with the bus bars aligned and in communication with the exposed upper surface of the slice. Prior to the positioning of the bus bar supporting molds and slice 14 within the die set, a suitable flux is applied to the surfaces that are to be bonded together. With the bus bar supporting molds and slice 14 thus arranged and fixedly positioned within the die set, the entire assembly is placed in an oven of conventional design. The oven temperature is set at approximately 325° C. and the assembly is maintained therein for a period of 15 to 18 minutes. During this interval, the soldering of the bus bars to the exposed coated ends of the cylindrical n and p type bismuth telluride rods is effected.

After cooling, the soldered assembly is removed from the die set and immersed in a solution of hydrochloric acid. As previously described, the supporting casting, which was used throughout the prior stages of the fabrication process as a supporting medium for the rods 10, is soluble in the hydrochloric acid. Accordingly, the casting is dissolved by the acid and the assembly including the joined rods and bus bars, when withdrawn from the bath, is free from oxides and the like. This assembly is illustrated in FIGURE 4.

The grid-like arrangement of n and p type bismuth telluride rods with the copper bus bars 15 firmly bonded thereto is ready for the final assembly steps after removal from the acid bath. In this connection, a pair of rectangular plates 17, which serve as electrical insulators and as good thermal conductors, are cemented over the exposed surfaces of the bus bars 15 to provide the composite hot and cold junction surfaces of the completed module shown in FIGURE 5.

The plates 17, which are preferably anodized aluminum plates, are joined to the exposed surfaces of the bus bars by an epoxy cement preferably containing a material such as magnesium oxide to enhance the thermal conductivity of the bond between the plates and the bus bars. The joining of the anodized plates 17 to the bus bars 15 is initiated by coating one surface of the plates with a uniform layer of the thermally conductive cement and subsequently bringing the plates into contact with the bus bars under pressure. A suitable mold is utilized for this latter purpose. The mold serves both to align the plates and to confine the entire assembly in fixed relation while a weight is applied thereto to effect a binding of the plates to the exposed surfaces of the bus bars. The mold containing the entire weighted unit is placed in an oven for a period of four hours at a temperature of 60° C. to cure the epoxy. After the epoxy has been cured, the modules are removed from the molding structure.

At this stage of the fabrication process, the module is capable of use separately or in conjunction with a plurality of similarly constructed units to provide a thermoelectric device for larger scale applications. Whether used individually or in conjunction with other similar modules, the units are subsequently positioned in an enclosure that is lined with a material such as Teflon. The enclosure is designed to confine the module or modules while a suitable insulating material is introduced thereto so as to fill the interstices in the grid-like arrangement of rods 10 between the cooling and heat dissipating plates 17. Preferably, the insulating material employed for this purpose is polyurethane foam which is placed in the enclosure along with a suitable catalyst. A lid is clamped over the box with the foam, catalyst and module or modules positioned therein. The covered enclosure is heated to approximately 60° C. for a period of about 45 minutes to enhance the foaming action of polyurethane. The foam is then allowed to cure for approximately one-half hour and the completed unit is thereafter removed from the enclosure. Any excess foam extending beyond the edges of the aluminum plates 17 is thereafter trimmed from the module and the completed unit appears as shown in FIGURE 5.

When a plurality of the individual modules as shown in FIGURE 5 are to be jointly utilized, these modules are stacked in an aligned arrangement and the projecting bus bars 16 are electrically connected. A thermoelectric unit including either one or a plurality of connected modules is preferably sealed (i.e. the exposed edge portions thereof) with a suitable epoxy material that prevents moisture from entering the module during the subsequent operation thereof. After the epoxy has been applied to the units it is cured in an oven for a period of sixteen hours at a temperature of 35° C. The resulting sealed units are then connected to a suitable testing apparatus to determine the capabilities of the completed modules.

After the modules have undergone a successful test they are then ready for use in a variety of applications. In this connection, the completed modules are preferably printed with a selected design using conventional silk screen printing techniques. The design is used to label the modules with the appropriate technical data (e.g. thermal and electrical characteristics of the module). Moreover the design preferably provides an outside border adjacent the periphery of the plates 17 provided therewith. This border serves as a dam or confining molding for a quantity of epoxy cement that is utilized when, for example, one or more of the modules are secured to heat exchangers or otherwise similarly employed.

From the foregoing it should be apparent that an improved method of fabricating thermoelectric modules is provided by the present invention. The various enumerated steps are susceptible to a variety of machine operations so that the method provides an efficient and low cost process for producing such modules on a large scale, in-line production basis.

Various novel features of the present invention are set forth in the following claims.

What is claimed is:

1. A method of fabricating thermoelectric modules which comprises forming a self-supporting structure of a soluble casting medium with a plurality of elongated dissimilar thermoelectric elements arranged therein in a preselected generally parallel configuration in which each element is adjacent a dissimilar element, slicing said structure by generally parallel cuts which are generally transverse to said elongated thermoelectric elements and which sever said thermoelectric elements into sections so that the ends of said severed thermoelectric sections in a slice lie in two planes, simultaneously soldering a plurality of bus bars to said ends of said thermoelectric element sections in said slice to interconnect dissimilar thermoelectric element sections into thermocouple pairs arranged in electrical series, immersing the slice and bus bar arrangement in a bath which dissolves the casting medium without harming said thermoelectric element sections or said bus bars to provide a grid-like structure of thermocouples.

2. A method of fabricating thermoelectric modules which comprises assembling a plurality of elongated thermoelectric elements of dissimilar conductivity types in a support structure in a configuration in which said elements are generally parallel and each element is adjacent an element having a dissimilar conductivity, casting a soluble supporting medium about said assembled array to provide a self-supporting unit, slicing said unit by generally parallel cuts which are generally transverse to said elongated thermoelectric elements and which sever said thermoelectric elements into sections so that the ends of said severed thermoelectric sections in a slice lie in two planes, immersing the slice in at least one bath of a molten soldering agent which adheres only to the exposed ends of said thermoelectric element sections confined within the supporting medium of the slice, selectively joining a plurality of bus bars to the ends of said thermoelectric element sections coated with said soldering agent so that a plurality of serially connected thermocouples is formed, immersing the joined slice and bus bar arrangement in a bath which effects dissolution of the supporting medium without harming said thermoelectric sections or said bus bars, so that a self-supporting grid-like structure is provided, joining a pair of electrically insulating and thermally conductive plates to the exposed surfaces of the bus bars, and filling the interstices within the grid-like structure with a suitable insulating material.

3. A method of fabricating thermoelectric modules which comprises assembling a plurality of two types of elongated dissimilar semiconductor elements in an alternate array of preselected configuration within a supporting structure, casting a plaster supporting medium about the assembled array of dissimilar semiconductor elements so that a self-supporting casting which includes the assembled semiconductor elements is provided, cutting the plaster casting in a direction transverse said elongated semiconductor elements into a plurality of slices of predetermined thickness, each slice having the oppositely disposed ends of the dissimilar semiconductor element sections aligned with the oppositely disposed surfaces thereof, immersing the slices in at least one bath of a molten soldering agent which adheres only to the exposed ends of the semiconductor element sections confined within the casting of each slice, simultaneously joining a plurality of bus bars in a suitable electrical arrangement to the ends of the semiconductor element sections containing the soldering agent so that a plurality of serially connected thermocouples is formed, immersing the joined slice and bus bar units in a bath in which the plaster casting is soluble so that a self-supporting grid-like structure of semiconductor element sections with the bus bars joined thereto is provided, joining a pair of electrically insulating and thermally conductive plates to the exposed surfaces of the bus bars in each grid-like arrangement, and introducing a suitable insulating material to the region between said insulating plates to fill the interstices between the grid-like arrangement of semiconductor element sections.

4. A method of fabricating thermoelectric modules on a large scale production basis, which method comprises assembling a plurality of elongated n and p type semiconductor elements within a supporting structure so that said semiconductor elements are arranged in a preselected configuration with each element being disposed adjacent a dissimilar element, casting a sorel-type cement supporting medium about the assembled dissimilar semiconductor elements so that a self-supporting cement casting including the assembled semiconductor elements is provided, cutting the cement casting in a direction transverse said elongated semiconductor elements into a plurality of slices of predetermined thickness, the oppositely disposed ends of the severed semiconductor element sections being aligned with the oppositely disposed surfaces of said slices, immersing the slices in a first bath of a suitable molten metal so as to form a base layer for a soldering agent to be applied to the exposed ends of the semiconductor element sections, immersing the slices in a second bath of a molten soldering agent which adheres only to the base layer on the exposed ends of the semiconductor element sections, disposing a plurality of bus bars in ordered arrangement in pairs of holders, placing one of said coated slices between a pair of said holders, joining said bus bars to said semiconductor element sections in said slice by pressing said bus bars into contact with the aligned ends of the semiconductor element sections and subjecting the units to a high temperature environment so that the soldering agent binds the bus bars to the semiconductor element sections contacted thereby, said bus bars being arranged so as to provide a plurality of serially connected thermocouples having cooling and heat-dissipating junctions, immersing the joined assembly in a bath of a suitable acid which dissolves the cement casting without harming the semiconductor element sections or the bus bars so that a self-supporting grid-like structure is provided, joining a pair of electrically insulating and thermally conductive plates to the exposed surfaces of the bus bars to provide large area heat dissipating and cooling surfaces, filling the interstices within said grid-like structure with a suitable insulating material, and coating the completed module with a moisture resistant coating.

References Cited by the Examiner

UNITED STATES PATENTS

| | | | |
|---|---|---|---|
| 2,752,662 | 7/1956 | Crooks et al. | 29—424 |
| 2,947,150 | 8/1960 | Roeder | 136—4.2 |

FOREIGN PATENTS

| | | |
|---|---|---|
| 811,755 | 4/1959 | Great Britain. |
| 1,072,410 | 12/1959 | Germany. |

JOHN F. CAMPBELL, *Primary Examiner.*

WILLIAM I. BROOKS, *Assistant Examiner.*